United States Patent [19]

Gentsch et al.

[11] Patent Number: 5,293,120
[45] Date of Patent: Mar. 8, 1994

[54] RESONATOR FOR ELECTRON SPIN RESONANCE SPECTROSCOPY

[75] Inventors: Ekkehard Gentsch, Karlsruhe; Dieter Schmalbein, Marxzell-Burbach, both of Fed. Rep. of Germany

[73] Assignee: Bruker Analytische Messtechnik GmbH, Fed. Rep. of Germany

[21] Appl. No.: 847,711

[22] Filed: Mar. 6, 1992

[30] Foreign Application Priority Data

Mar. 9, 1991 [DE] Fed. Rep. of Germany ....... 4107627

[51] Int. Cl.⁵ ............................................. G01R 33/20
[52] U.S. Cl. .................................................... 324/316
[58] Field of Search ................. 324/300, 316, 318, 322

[56] References Cited

U.S. PATENT DOCUMENTS

| | | | |
|---|---|---|---|
| 2,727,950 | 12/1955 | Wise | 179/171 |
| 3,691,453 | 9/1972 | Rupp, Jr. et al. | 324/316 |
| 3,828,244 | 8/1974 | Hyde | 324/316 |
| 4,463,328 | 7/1984 | Doty | 324/316 |

FOREIGN PATENT DOCUMENTS 862777 1/1953 Fed. Rep. of Germany .

OTHER PUBLICATIONS

Literature, W. Froncisz, T. Oles "Q-band loop-gap resonator", Rev.Sci.Instrum.57(6), Jun. 1986, pp. 1095-1099.

*Primary Examiner*—Michael J. Tokar
*Attorney, Agent, or Firm*—Claude A. S. Hamrick

[57] ABSTRACT

A resonator is provided for electron spin resonance spectroscopy. It comprises a resonant element comprising a cavity, and a predetermined oscillation mode is capable of propagating in the cavity. The resonator comprises further a coupling element comprising a waveguide section. Finally, the resonator is equipped with a tuning arrangement for coupling an electromagnetic wave in the waveguide section with the oscillation mode in the cavity. The tuning arrangement comprises at least one conductive wafer, which is arranged at the free end of a tuning rod projecting into the waveguide section and is adapted for displacement in the direction of a longitudinal axis of the tuning rod. The wafer further coacts with a coupling element disposed between the waveguide section and the cavity. Two wafers are arranged on either side of the coupling element, in the direction of the longitudinal axis, and can be displaced in opposite senses relative to the coupling element.

4 Claims, 2 Drawing Sheets

RESONATOR FOR ELECTRON SPIN RESONANCE SPECTROSCOPY

The present invention relates to a resonator for electron spin resonance spectroscopy having a resonant element comprising a cavity adapted to permit a predetermined oscillation mode to propagate, a coupling element comprising a waveguide section, and a tuning arrangement for coupling an electromagnetic wave in the waveguide section with the oscillation mode in the cavity, the tuning arrangement comprising at least one conductive wafer, which is arranged at the free end of a tuning rod projecting into the waveguide section and is adapted for displacement in the direction of a longitudinal axis of the tuning rod, and the wafer coacting further with a coupling element disposed between the waveguide section and the cavity.

A resonator of the before-described type has been generally known in electron spin resonance spectroscopy.

In the case of the known resonators of this type, the waveguide section terminates, in a plane extending radially to the longitudinal direction, at a boundary wall of the resonant element element which includes, for example, a cuboid or cylindrical cavity. In the radial boundary wall, there is provided an opening having the least possible wall thickness, which serves as a coupling iris. The coupling element seats a rotatable threaded rod which consists of a plastic material and whose lower end projects into the waveguide section and carries on its free end a conductive wafer, consisting for example of brass, while its upper end projects beyond the top of the coupling element. In this latter area, the threaded rod is provided with a slot, an eccentric profile or the like, so that the threaded rod can be gripped from above, using a suitable tool, and can be rotated if the resonator is accessible only with difficulty, being positioned between the pole shoes of a magnet.

As the threaded rod is rotated, the conductive wafer is moved past the outside of the coupling iris so that the standing wave ratio of the electric wave in the waveguide section can be varied correspondingly. Under optimum coupling conditions, the entire microwave energy irradiated into the waveguide section will consequently be directed into the cavity of the resonator where a predetermined oscillation mode is excited in this way.

The tuning arrangement is necessary in the case of the known resonators in order to enable the resonator to be balanced also when samples of different dielectric constants, i.e. of different dielectric losses, are to be measured, because in any such case the resonator will be loaded differently, depending on the sample to be measured.

Now, it has been found that sometimes the coupling behavior of such an arrangement is insufficient, the tuning arrangement being too small, and the particular type of construction may provide disadvantages as regards the geometry of the excited oscillation mode.

Now, it is the object of the present invention to improve a resonator of the type described above in such a way as to enable it to be tuned within broad limits, while achieving optimum conditions, geometrically, for the excitation of an oscillation mode in the cavity.

The invention achieves this object with a resonator of the before-mentioned type by the fact that two wafers are arranged on either side of the coupling element, in the direction of the longitudinal axis, and can be displaced in opposite senses relative to the coupling element.

This solves the problem underlying the invention fully and perfectly because one obtains in this manner a symmetrical coupling arrangement which provides on the one hand a wide tuning range and, on the other hand, an ideal geometry of the arrangement because strictly symmetrical conditions prevail in the area of the coupling arrangement so that any unsymmetrical distortion of the field patters is positively excluded.

According to one practical example of the invention, two tuning rods are provided in the direction of the longitudinal axis, and a first tuning arrangement, which is equipped with a first thread, coacts with a first threaded bore of the coupling element and has its free end, which projects into the waveguide section, provided with a second threaded bore equipped with a second thread and passing through the first wafer, while a second tuning rod is arranged for axial displacement, but fixed against rotation, in a bore of the coupling element and is provided on its free end, which projects into the waveguide section, with a threaded portion passing through the second wafer and coacting with the second threaded bore, the first thread and the second thread being directed in the same sense, and the second thread having twice the pitch of the first thread.

These features offer the advantage that a constructionally extremely simple design is obtained which ensures by mechanical means that the two conductive wafers move along the longitudinal axis symmetrically, but in opposite senses. Due to the simplicity of this arrangement, it can be employed at very different temperatures, which is desirable for electron spin resonance measurements as these may be carried out near absolute zero, but also at temperatures of several 100° Centigrade.

Another embodiment according to the invention is characterized by the fact that the coupling element is a coupling loop which comprises two straight, free legs and extends on both sides of the wafers in a radial plane, relative to the longitudinal axis, while a bend of the coupling loop, which interconnects the two legs, projects into the cavity.

This feature provides the advantage that the coupling loop defines again a plane which can be approached by the two conductive wafers symmetrically and in opposite directions, the two conductive wafers being arranged in parallel planes, relative to the plane defined by the coupling loop.

Other advantages of the invention will appear from the specification and the attached drawing.

It is understood that the features that have been described before and will be explained hereafter may be used not only in the described combinations, but also in any other combination, or individually, without leaving the scope and intent of the present invention.

One embodiment of the invention will now be described in more detail with reference to the drawing in which.

Figure 1:
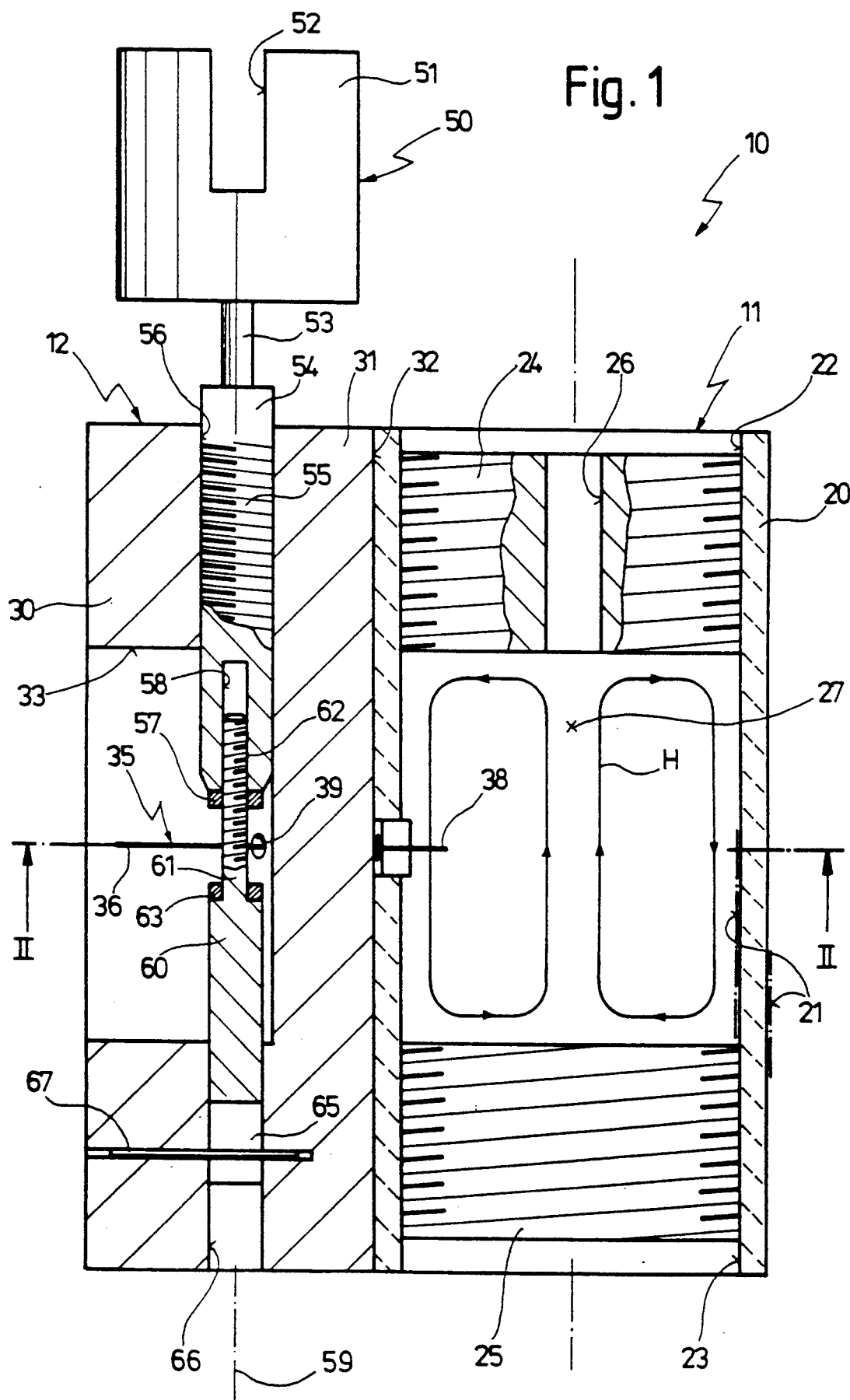
FIG. 1 shows a cross-sectional side view through one embodiment of a resonator according to the invention, viewed along line I—I in FIG. 2.

In the figures, a resonator for electron spin resonance spectroscopy is indicated generally by 10. The resonator 10 may be designed, for example, for X-band measurements, i.e. for measurements in the range of about 10 GHz.

The resonator 10 consists substantially of a resonant element 11 and a coupling element 12.

In the illustrated embodiment, the coupling element 12 comprises a cylindrical ceramic tube 20 which is provided with an electrically conductive coating 21 at least on its inside, but preferably also on its outside. The ceramic tube 20 has its upper and its lower ends connected with internal threads 22 and 23, respectively. The internal threads 22, 23 can receive an upper screw-in element 21 and a lower screw-in element 25, respectively. The screw-in elements 24, 25 may consist either of metal or else of a ceramic material, or may at least be provided with an electrically conductive coating on their inner surface. The upper screw-in element 24 is provided with a sample opening 26 in order to enable samples to be introduced into a cavity 27 which is defined by the ceramic tube 20 and the screw-in elements 24, 25.

In the case of the embodiment illustrated in the figures, one therefore obtains a symmetrical resonator 10 in which, for example, a $TÉ_{011}$ oscillation mode can propagate and is excited, as indicated by field lines H in the magnetic field in FIG. 1.

The coupling element 12 consists essentially of a waveguide flange 30 for screwing-on usual waveguides, for example X-band waveguides. The waveguide flange 30 is following by a coupling section 31 consisting of a metallic material. The coupling section 31 is provided, on its side opposite the waveguide flange 30, with a flute 32 which is in intimate contact with the outer circumference of the ceramic tube 20. The coupling section 31 is connected at this point with the ceramic tube 20, for example by soldering or by means of an electrically conductive adhesive.

The waveguide flange 30 comprises, as usual, a waveguide section 33 whose inner dimensions are adapted to the usual inner dimensions of waveguides, depending on what band has been selected in the particular case (for example S, L, X, K or Q-band).

Figure 2:
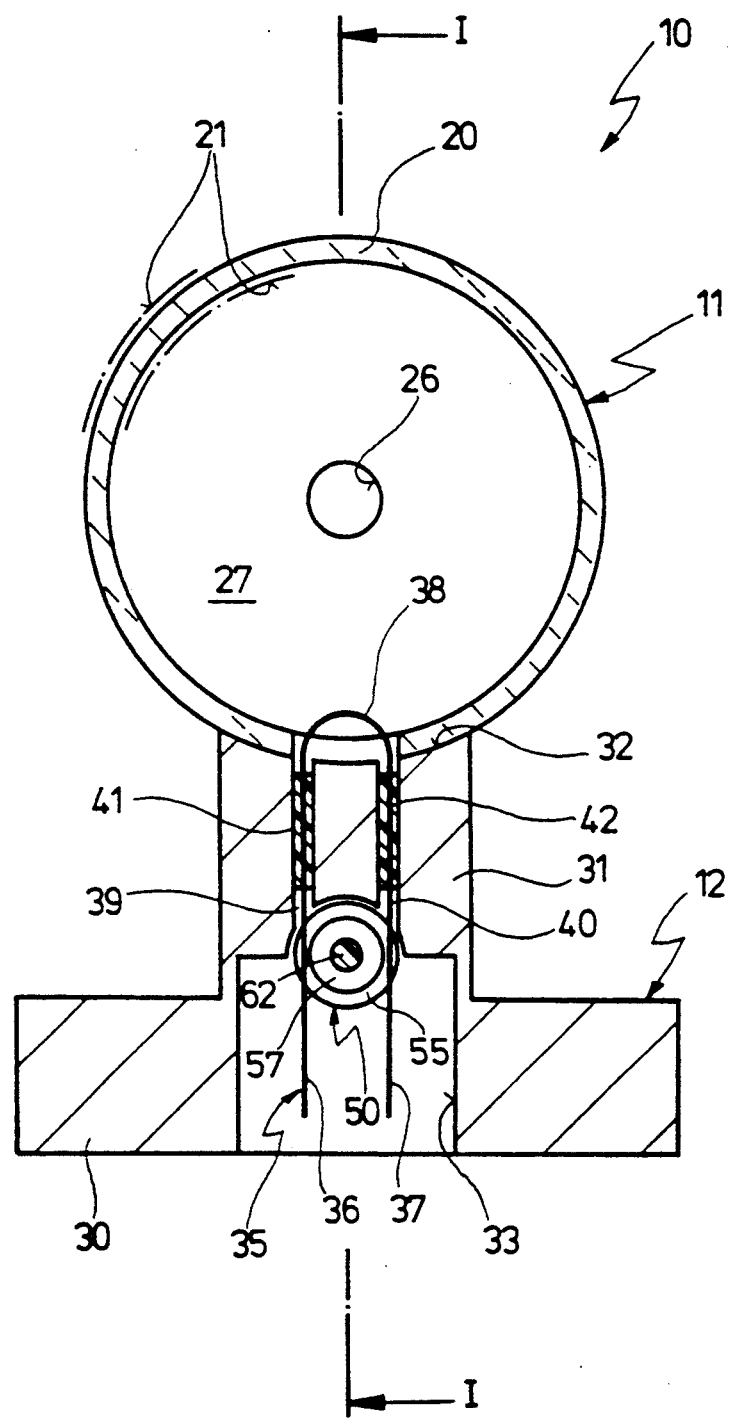
FIG. 2 shows a horizontal section through the resonator of FIG. 1, along line II—II in FIG. 1.

A coupling loop 35 serves for coupling an electromagnetic wave capable of propagating in the waveguide section 33 with the oscillation mode capable of propagating in the cavity 27. The coupling loop 35 exhibits a substantially U-shaped form, as viewed in the top view of FIG. 2. Accordingly, it comprises two parallel free legs 36, 37 and a bend 38 interconnecting the two legs 36, 37. While the bend 38 projects into the cavity 27, the legs 36, 37 pass at first through two through-bores 39, 40 where they are held, in insulated relationship, in insulated bushings 41, 42, and project thereafter a considerable length into the waveguide section 33.

Tuning of the resonator 10 is effected by a tuning arrangement indicated generally by 50.

The tuning arrangement 50 terminates at its upper end, as viewed in FIG. 1, by a usual setting knob 51, which is provided with a slot 52 or some other eccentric profile permitting the setting knob 51 to be gripped and rotated from above, for example by means of a rod-shaped tool, a screwdriver, or the like. Unless otherwise stated hereafter, the elements of the tuning arrangement 50 consist of a non-conductive material, for example a plastic material, such as PTFE.

The setting knob 51 is followed, via a narrower section 53, by a first tuning rod 54 carrying on its outer circumference a fine thread 55 coacting with a matching first threaded bore 56 in the coupling section 31.

The lower free end, as viewed in FIG. 1, of the first tuning rod 54 carries an electrically conductive wafer 57, which may be a small brass disk, a gold-plated copper or brass disk, or the like. The lower free end of the first tuning rod 54, and the conductive wafer 57 are both passed by a second threaded bore 58.

The first tuning rod 54, with the threaded bores 56 and 58, defines a longitudinal axis 59 of the tuning arrangement 50.

The first tuning rod 54 is following at its lower end, as viewed in FIG. 1, by a second tuning rod 60 extending in the direction of the longitudinal axis 59. The upper free end of the second tuning rod 60 is equipped with a threaded section 61 of reduced cross-section. The threaded section 61 coacts with the second threaded bore 58 in the first tuning rod 54. At its lower end, the threaded section 61 is enclosed by a second conductive wafer 63 of a size and shape corresponding to that of the conductive wafer 57 at the lower end of the first tuning rod 54.

For the rest, the second tuning rod 60 is threadless and provided with an axial slot 65 on its lower end. The second tuning rod 60 is guided in an axial bore 66 of the coupling section 31. In order to fix the second tuning rod 60 against rotation, a fixing pin 67 is passed through the slot 65.

The operating of the tuning arrangement 50 is as follows:

When the setting knob 51 is rotated by means of a suitable tool, then this rotation is transmitted to the first tuning rod 54, via the section 53. Since the fine thread 55 of the first tuning rod 54 coacts with the first threaded bore 56, the first tuning rod 54 will move into the coupling section 31, for example from the top to the bottom, as viewed in FIG. 1.

Now, the threads 55 and 62 are designed in such a way that while the threads are directed in the same sense, the pitch of the thread 62 on the threaded section 61 of the second tuning rod 60, and in the second threaded bore 58 of the first tuning rod 54, is twice that of the pitch of the fine thread 55 at the upper end of the first threaded rod 54.

Given the fact that the second tuning rod 60 can be displaced axially in the cylindrical bore 66 of the coupling section 31, but is fixed against rotation (fixing pin 67), the first tuning rod 54 will entrain the threaded section 61 into the second threaded bore 58, as it moves down into the coupling section 31, as viewed in FIG. 1, with the consequence that the second tuning rod 60 moves in upward direction, as viewed in FIG. 1.

The pitch of the thread 62 being twice that of the fine thread 55, the tuning rods 54, 60 move toward each other, in opposite senses, but over the same length of displacement, related to one revolution of the setting knob 51.

This means that in the described embodiment the conductive wafers 57 and 63 approach the coupling loop 35 at uniform speed, but in opposite senses.

When the setting knob 51 is turned in opposite direction, the movements will be oppositely directed, too, i.e. the conductive wafers 57 and 63 will move away from the coupling loop 35, in the direction of the longitudinal axis 59, at uniform speed, but in opposite directions.

· It is ensured in this way that symmetrical conditions prevail at all times in the area of the coupling loop 35, provided the basic setting of the tuning rods, relative to the coupling section 31, has been correctly adjusted during initial assembly of the tuning arrangement 50.

We claim:

1. A resonator for electron spin resonance spectroscopy comprising:

means forming a cavity configured to propagate a predetermined electromagnetic wave oscillation mode;

means forming a waveguide section for receiving input electromagnetic energy;

coupling means for coupling said electromagnetic energy from said waveguide section to said cavity; and tuning means including an elongated tuning rod means extending into said waveguide section and being displaceable along a longitudinal axis, said tuning means further including a pair of conductive wafers carried by said tuning rod means, said wafers being respectively disposed on opposite sides of said coupling means and displaceable by said tuning rod means relative to said coupling means.

2. A resonator as recited in claim 1, wherein said tuning rod means includes first and second elongated rods aligned in the direction of said longitudinal axis, said first rod being equipped with a first thread having a certain pitch and which coacts with a threaded bore formed in a wall of said waveguide section, and having a free end carrying one of said wafers and projecting into said waveguide section, said free end being provided with a second threaded bore equipped with a second thread having a certain pitch, said second rod being axially disposed within a second bore in a wall of said waveguide section but fixed against rotation therein and having a free end projecting into said waveguide section and provided with a threaded portion passing into and coacting with said second threaded bore, said first thread and said second thread being directed in the same sense, but said second thread having twice the pitch of said first thread, said second rod carrying the other of said wafers.

3. A resonator as recited in claim 2, wherein said coupling means includes a conductive loop having two straight, free legs respectively extending on opposite sides of said wafers in a plane transverse to said longitudinal axis, and a bent segment interconnecting said two legs and projecting into said cavity.

4. A resonator as recited in claim 3, wherein said coupling means includes a conductive loop having two straight, free legs respectively extending on opposite sides of said wafers in a plane transverse to said longitudinal axis, and a bent segment interconnecting said two legs and projecting into said cavity.

* * * * *